(12) United States Patent
Wakiyama et al.

(10) Patent No.: US 11,322,373 B2
(45) Date of Patent: May 3, 2022

(54) LIQUID PROCESSING APPARATUS

(71) Applicant: TOKYO ELECTRON LIMITED, Tokyo (JP)

(72) Inventors: Terufumi Wakiyama, Kumamoto (JP); Norihiro Ito, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 594 days.

(21) Appl. No.: 15/881,984

(22) Filed: Jan. 29, 2018

(65) Prior Publication Data
US 2018/0226277 A1 Aug. 9, 2018

(30) Foreign Application Priority Data
Feb. 9, 2017 (JP) .............................. JP2017-022350

(51) Int. Cl.
*H01L 21/67* (2006.01)
*H01L 21/687* (2006.01)

(52) U.S. Cl.
CPC .... *H01L 21/6708* (2013.01); *H01L 21/67051* (2013.01); *H01L 21/68792* (2013.01)

(58) Field of Classification Search
CPC ....................... H01L 21/6708; H01L 21/68792
See application file for complete search history.

(56) References Cited

U.S. PATENT DOCUMENTS

| | | | |
|---|---|---|---|
| 2002/0096196 A1* | 7/2002 | Toshima | B08B 3/10 134/21 |
| 2004/0162007 A1* | 8/2004 | Phan | B24B 53/017 451/36 |
| 2010/0147335 A1* | 6/2010 | Ito | H01L 21/68792 134/33 |
| 2012/0160278 A1* | 6/2012 | Higashijima | H01L 21/6708 134/33 |
| 2014/0065295 A1* | 3/2014 | Emoto | H01L 21/67051 427/8 |

(Continued)

FOREIGN PATENT DOCUMENTS

| | | |
|---|---|---|
| JP | 2004-273715 | 9/2004 |
| JP | 2007-318140 | 12/2007 |

(Continued)

*Primary Examiner* — Parviz Hassanzadeh
*Assistant Examiner* — Margaret D Klunk
(74) *Attorney, Agent, or Firm* — Amin, Turocy & Watson, LLP

(57) ABSTRACT

A liquid processing apparatus according to an embodiment includes a holding unit, a driving unit, a shaft, and a nozzle. The driving unit rotates the substrate and the holding unit that horizontally holds the substrate. The shaft is extended along an axial direction of a rotation axis. The nozzle includes a base that is attached to an upper end of the shaft, and a liquid supply unit that is extended from the base to a radial-direction outer side of the substrate and includes discharge ports formed to discharge the liquid toward a lower surface of the substrate. The shaft and the base are configured to include a discharge passage that is formed along the axial direction to discharge the liquid discharged toward the lower surface of the substrate. The base includes a concave portion that is concave downward to cause the liquid to flow toward the discharge passage.

15 Claims, 8 Drawing Sheets

(56) References Cited

U.S. PATENT DOCUMENTS

| | | | | |
|---|---|---|---|---|
| 2015/0273491 A1* | 10/2015 | Ootagaki | ................ | B05B 1/265 239/11 |
| 2016/0005630 A1* | 1/2016 | Fujiwara | ........... | H01L 21/67109 438/5 |
| 2017/0278729 A1* | 9/2017 | Hayashi | .............. | H01L 21/6708 |

FOREIGN PATENT DOCUMENTS

| | | | | |
|---|---|---|---|---|
| JP | 2007-335868 | | 12/2007 | |
| JP | 2012-151439 | | 8/2012 | |
| JP | 2012-182371 | | 9/2012 | |
| JP | 2016-111302 | | 6/2016 | |
| WO | WO-2016052642 A1 * | | 4/2016 | ....... H01L 21/67034 |

* cited by examiner

LIQUID PROCESSING APPARATUS

CROSS-REFERENCE TO RELATED APPLICATIONS

The present application claims priority to and incorporates by reference the entire contents of Japanese Patent Application No. 2017-22350 filed in Japan on Feb. 9, 2017.

FIELD

An exemplary embodiment disclosed herein relates to a liquid processing apparatus.

BACKGROUND

Conventionally, there has been known a liquid processing apparatus that includes a nozzle unit for supplying a fluid onto the lower surface of a substrate (see, e.g., Japanese Laid-open Patent Publication No. 2007-335868).

However, the liquid processing apparatus has a possibility that liquid discharged toward the lower surface of the substrate remains on the central upper-end surface of the nozzle unit. In this case, the liquid that remains on the upper end surface may adhere to the lower surface of the substrate.

SUMMARY

It is an object of the present invention to at least partially solve the problems in the conventional technology.

A liquid processing apparatus according to an aspect of an embodiment includes a holding unit, a driving unit, a shaft, and a nozzle. The holding unit horizontally holds a substrate. The driving unit rotates the substrate and the holding unit in a state where the substrate is held by the holding unit. The shaft includes a rotation axis of the substrate held by the holding unit, is extended along an axial direction of the rotation axis, and is provided below the substrate. The nozzle discharges liquid toward a lower surface of the substrate. Moreover, the nozzle includes a base that is attached to an upper end of the shaft, and a liquid supply unit that is extended from the base to a radial-direction outer side of the substrate and includes discharge ports formed to discharge the liquid toward the substrate. The shaft and the base are configured to include a discharge passage that is formed along the axial direction to discharge the liquid discharged toward the lower surface of the substrate. The base includes a concave portion that is concave downward to cause the liquid to flow toward the discharge passage.

BRIEF DESCRIPTION OF DRAWINGS

A more complete appreciation of the present application and many of the attendant advantages thereof will be readily obtained as the same becomes better understood by reference to the following detailed description when considered in connection with the accompanying drawings, wherein.

DESCRIPTION OF EMBODIMENTS

An exemplary embodiment of a liquid processing apparatus disclosed in the present application will be described below in detail with reference to the accompanying drawings. In addition, the illustrative embodiment disclosed below is not intended to limit the present invention.

Figure 1:
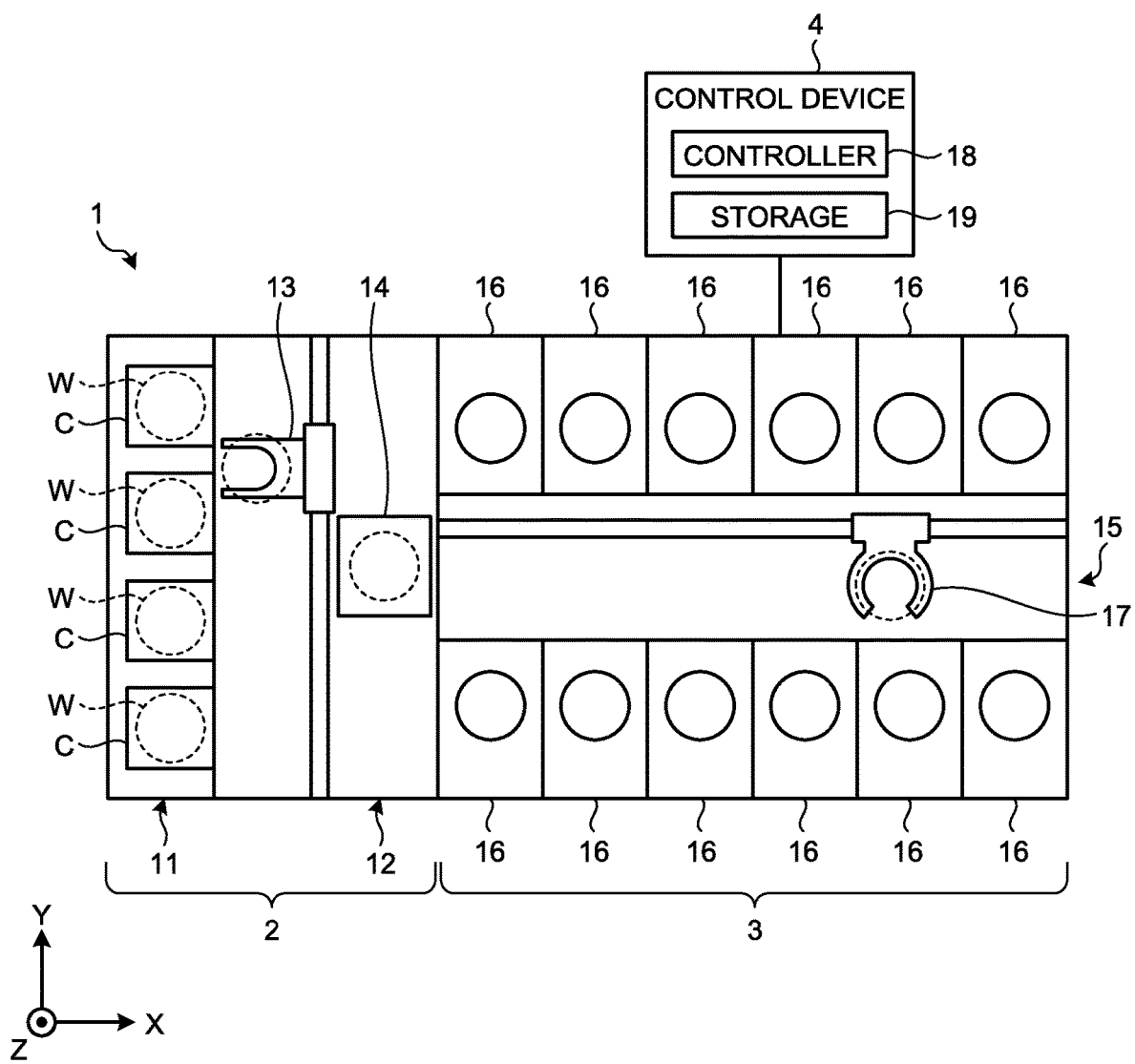
FIG. 1 is a diagram illustrating a schematic configuration of a substrate processing system according to an embodiment.

FIG. 1 is a diagram illustrating a schematic configuration of a substrate processing system 1 according to the present embodiment. Hereinafter, in order to make a positional relationship clear, X-axis, Y-axis, and Z-axis will be defined to be perpendicular to each other and the positive Z-axis direction is regarded as a vertically upward direction.

As illustrated in FIG. 1, the substrate processing system (also referred to as liquid processing apparatus) 1 includes a carry-in/out station 2 and a processing station 3. The carry-in/out station 2 and the processing station 3 are provided adjacent to each other.

The carry-in/out station 2 includes a carrier placing section 11 and a transfer section 12. In the carrier placing section 11, a plurality of carriers C are placed to horizontally accommodate a plurality of substrates, namely, semiconductor wafers (hereinafter, wafer W) in the present embodiment.

The transfer section 12 is provided adjacent to the carrier placing section 11, and includes therein a substrate transfer device 13 and a delivery unit 14. The substrate transfer device 13 includes a wafer holding mechanism configured to hold the wafer W. The substrate transfer device 13 is movable horizontally and vertically and is pivotable around a vertical axis, and transfers the wafer W between the corresponding carrier C and the delivery unit 14 by using the wafer holding mechanism.

The processing station 3 is provided adjacent to the transfer section 12. The processing station 3 includes a transfer section 15 and a plurality of processing units 16. The plurality of processing units 16 are provided side by side at both sides of the transfer section 15.

The transfer section 15 includes therein a substrate transfer device 17. The substrate transfer device 17 includes a wafer holding mechanism configured to hold the wafer W. The substrate transfer device 17 is movable horizontally and vertically and is pivotable around the vertical axis, and transfers the wafer W between the delivery unit 14 and the corresponding processing unit 16 by using the wafer holding mechanism.

Each of the processing units 16 performs a predetermined substrate processing on the wafer W transferred by the substrate transfer device 17.

The substrate processing system 1 further includes a control device 4. The control device 4 is a computer, for example. The control device 4 includes a controller 18 and a storage 19. The storage 19 stores therein a program for controlling various types of processes that are performed in the substrate processing system 1. The controller 18 reads out and executes the program stored in the storage 19 to control operations of the substrate processing system 1.

The program may be recorded in a computer-readable recording medium and thus may be installed into the storage 19 of the control device 4 from the recording medium. A computer-readable recording medium includes, for example, a hard disk (HD), a flexible disk (FD), a compact disc (CD), a magneto-optical disk (MO), and a memory card.

In the substrate processing system 1 configured as described above, the substrate transfer device 13 of the carry-in/out station 2 first takes out the wafer W from one of the carriers C placed in the carrier placing section 11, and places the taken wafer W on the delivery unit 14. The wafer W placed on the delivery unit 14 is taken out from the delivery unit 14 by the substrate transfer device 17 of the processing station 3, and is carried into one of the processing units 16.

The wafer W carried into the processing unit 16 is processed by the processing unit 16, and then is carried out from the processing unit 16 and placed on the delivery unit 14 by using the substrate transfer device 17. Then, the processed wafer W placed on the delivery unit 14 is returned to the corresponding carrier C in the carrier placing section 11 by using the substrate transfer device 13.

Figure 2:
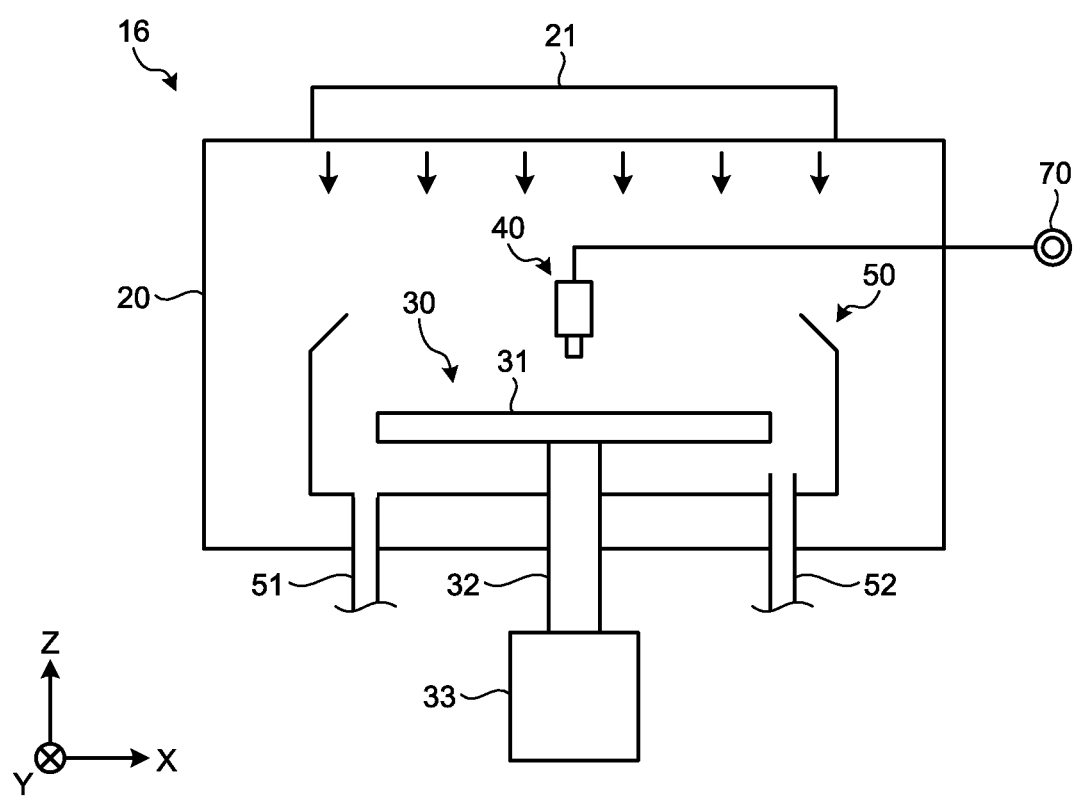
FIG. 2 is a diagram illustrating a schematic configuration of a processing unit.

Next, the processing unit 16 will be described with reference to FIG. 2. FIG. 2 is a diagram illustrating the schematic configuration of the processing unit 16.

As illustrated in FIG. 2, the processing unit 16 includes a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on a ceiling of the chamber 20. The FFU 21 forms a downflow within the chamber 20.

The substrate holding mechanism 30 includes a holding unit 31, a supporting unit 32, and a driving unit 33. The holding unit 31 horizontally holds the wafer W. The supporting unit 32 is a vertically extending member, and includes a bottom end rotatably supported by the driving unit 33 and a leading end horizontally supporting the holding unit 31. The driving unit 33 rotates the supporting unit 32 around the vertical axis. The substrate holding mechanism 30 rotates the supporting unit 32 by using the driving unit 33 to rotate the holding unit 31 supported by the supporting unit 32, and consequently rotates the wafer W held on the holding unit 31.

The processing fluid supply unit 40 supplies processing fluid onto the wafer W. The processing fluid supply unit 40 is connected to a processing fluid supply source 70.

The recovery cup 50 is arranged to surround the holding unit 31, and collects processing liquid scattered from the wafer W due to the rotation of the holding unit 31. A drain port 51 is formed on a bottom of the recovery cup 50. The processing liquid collected by the recovery cup 50 is discharged from the drain port 51 to the outside of the processing unit 16. In addition, an exhaust port 52 is formed on the bottom of the recovery cup 50 to discharge gas supplied from the FFU 21 to the outside of the processing unit 16.

Figure 3:
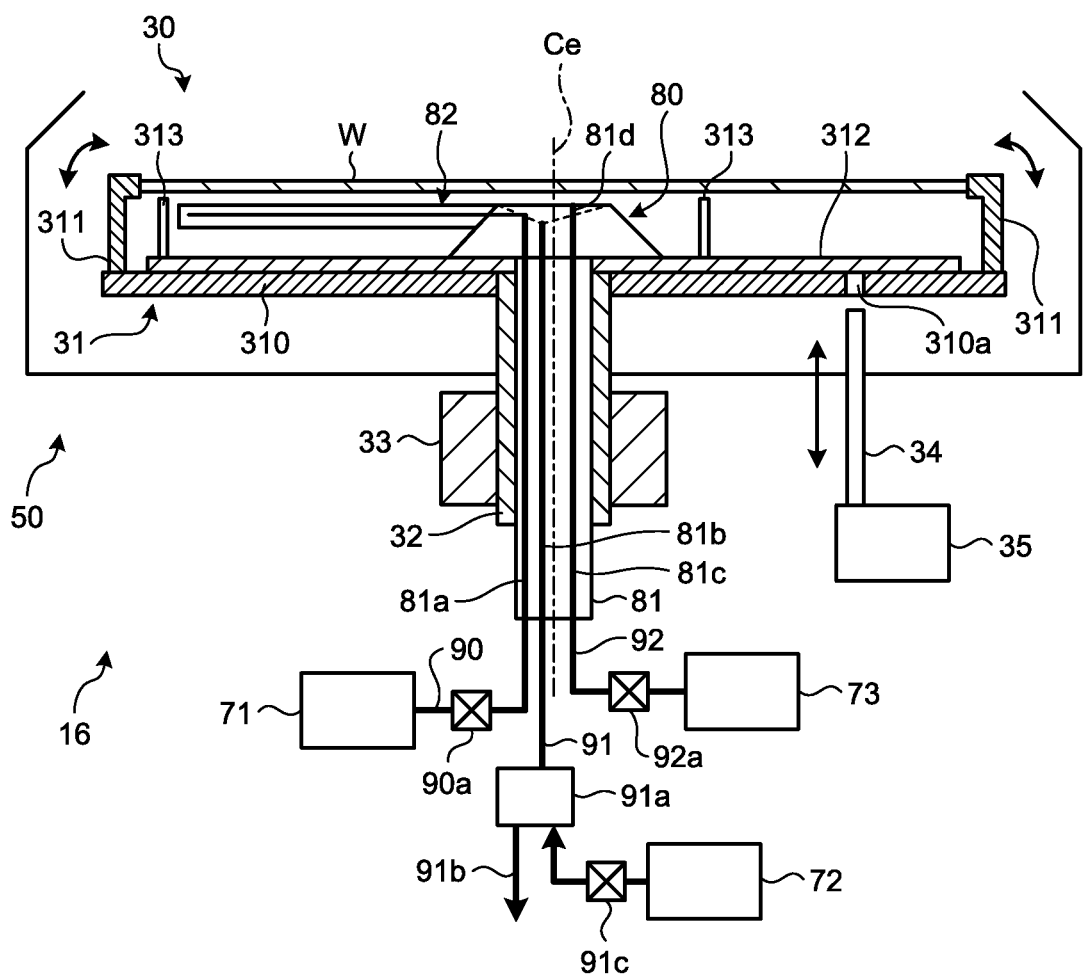
FIG. 3 is a diagram illustrating a specific configuration of the processing unit.

Hereinafter, the rotation axis of the supporting unit 32, namely, the rotation axis of the wafer W will be explained as a rotation axis Ce (see FIG. 3). In addition, the radial direction of the wafer W may be explained as a radial direction in some cases.

Herein, the processing unit 16 will be described in detail with reference to FIG. 3. FIG. 3 is a diagram illustrating a specific configuration of the processing unit 16. In FIG. 3, a part of the configuration, e.g., the processing fluid supply unit 40 etc. is not illustrated.

The holding unit 31 includes a holding plate 310, substrate holding parts 311, a lifting plate 312, and lifting pins 313.

The holding plate 310 has a discoid shape, and its central portion has a hole into which the upper end of the supporting unit 32 is inserted. The holding plate 310 is joined to the upper end of the supporting unit 32. The holding plate 310 is arranged coaxially with the supporting unit 32. The plurality of substrate holding parts 311 are provided on the upper surface of the outer circumferential end of the holding plate 310. For example, the substrate holding parts 311 are provided at three places at intervals of 120 degrees in a circumferential direction. The substrate holding parts 311 are swung around swing axes provided on their bottom ends closer to the holding plate 310 in accordance with the up-and-down motion of the lifting plate 312 so as to change the holding state of the wafer W.

The holding plate 310 includes a plurality of insertion holes 310*a* into which lifting/lowering members 34 can be inserted. For example, the insertion holes 310*a* are provided at three places at intervals of 120 degrees in a circumferential direction.

The lifting/lowering members 34 are respectively provided to correspond to the insertion holes 310*a*. The lifting/lowering members 34 are lifted and lowered by respective lifting/lowering driving units 35. When the lifting/lowering members 34 are raised by the respective lifting/lowering driving units 35 from waiting positions, the lifting/lowering members 34 are inserted into the respective insertion holes 310*a* and thus abut on the lifting plate 312 through the insertion holes 310*a*. Then, when the lifting/lowering members 34 are further raised by the respective lifting/lowering driving units 35, the lifting/lowering members 34 push up the lifting plate 312 upward. The lifting/lowering members 34 push up the lifting plate 312 up to a predetermined raising position. The predetermined raising position is a position at which the wafer W is carried into and out by the substrate transfer device 17. The lifting/lowering members 34 are not inserted into the insertion holes 310*a* at the waiting positions, and thus the holding plate 310 is rotatable.

The lifting/lowering members 34 may lift and lower the lifting plate 312 via intermediate members provided in the holding plate 310.

The lifting plate 312 has a discoid shape, and its central portion has an insertion hole into which a shaft 81 of a lower surface processing unit 80 is inserted. The lifting plate 312 is arranged coaxially with the holding plate 310, namely, the supporting unit 32. The lifting plate 312 is provided above the holding plate 310. When the lifting/lowering members 34 are located at the waiting positions, the lower surface of the lifting plate 312 abuts on the upper surface of the holding plate 310. The plurality of lifting pins 313 are provided on the upper surface of the outer circumferential end of the lifting plate 312. For example, the lifting pins 313 are provided at three places at intervals of 120 degrees in a circumferential direction. The diameter of the lifting plate 312 is smaller than that of the wafer W. The lifting plate 312 is formed not to abut on the substrate holding parts 311 when the lifting plate 312 is pushed up by the lifting/lowering members 34.

When the lifting plate 312 is pushed up, the lifting pins 313 abut on the lower surface of the wafer W to support the wafer W from its lower side in a state where the wafer W is not held by the substrate holding parts 311. Moreover, when the lifting plate 312 is lowered in a state where the wafer W is supported, the wafer W is held by the substrate holding parts 311. Then, the lifting pins 313 are separated from the lower surface of the wafer W when the lifting plate 312 is further lowered.

In a state where the lower surface of the lifting plate 312 abuts on the upper surface of the holding plate 310, the lifting plate 312 and the holding plate 310 are engaged by an engaging unit, for example. For that reason, when the supporting unit 32 is rotated by the driving unit 33, the lifting plate 312 and the holding plate 310 are rotated along with the supporting unit 32.

The processing unit 16 further includes the lower surface processing unit 80 that supplies temperature adjusting liquid etc. onto the lower surface of the wafer W. The lower surface processing unit 80 includes the shaft 81 and a nozzle 82. The shaft 81 and the nozzle 82 are formed of chemical-resistance resin, for example, PCTFE (polychloro-trifluoroethylene) resin. In FIG. 3, hatching of the lower surface processing unit 80 is omitted for illustrative purposes.

The shaft 81 is arranged coaxially with the supporting unit 32. The shaft 81 is inserted into the hollow supporting unit 32 and the insertion hole of the lifting plate 312 to rotatably support the supporting unit 32, the holding plate 310, and the lifting plate 312 via a bearing (not illustrated).

A first flow channel 81a, a second flow channel 81b, and a third flow channel 81c are formed inside the shaft 81. The flow channels 81a to 81c are extended in an axial direction. Alternatively, the shaft 81 may be formed in a hollow shape to provide therein pipes corresponding to the flow channels.

Temperature adjusting liquid, for example, deionized water such as warm water whose temperature is adjusted is supplied from a temperature-adjusting-liquid supply source 71 to the first flow channel 81a via a first pipe 90. In addition, the first pipe 90 is provided with an opening/closing valve 90a.

DIW (deionized water) such as room-temperature water is supplied from a DIW supply source 72 to the second flow channel 81b via a second pipe 91. In addition, the second pipe 91 is provided with a switching valve 91a. The second flow channel 81b and a part of the second pipe 91 communicate with a drain flow channel 91b by switching the switching valve 91a, and thus chemical liquid etc. adhering to the upper surface of the shaft 81 can be discharged via a liquid-discharge flow channel 820a (see, e.g., FIG. 4), the second flow channel 81b, and the second pipe 91. In other words, the liquid-discharge flow channel 820a, the second flow channel 81b, and the part of the second pipe 91 also function as a discharge passage. In addition, the second pipe 91 between the switching valve 91a and the DIW supply source 72 is provided with an opening/closing valve 91c. Alternatively, the switching valve 91a may have the function of the opening/closing valve 91c.

N2 gas is supplied from an N2 supply source (also referred to as gas supply unit) 73 to the third flow channel 81c via a third pipe 92. The temperature of N2 gas is adjusted to high temperature (e.g., around 90 degrees Celsius). The third flow channel 81c is also formed inside an N2 nozzle 81d, which is formed on the upper end of the shaft 81 and is extended upward. The N2 nozzle 81d is inserted into an insertion hole 820b (see, e.g., FIG. 4) formed in a base 820 (see, e.g., FIG. 4) of the nozzle 82. In addition, the third pipe 92 is provided with an opening/closing valve 92a.

Figure 4:
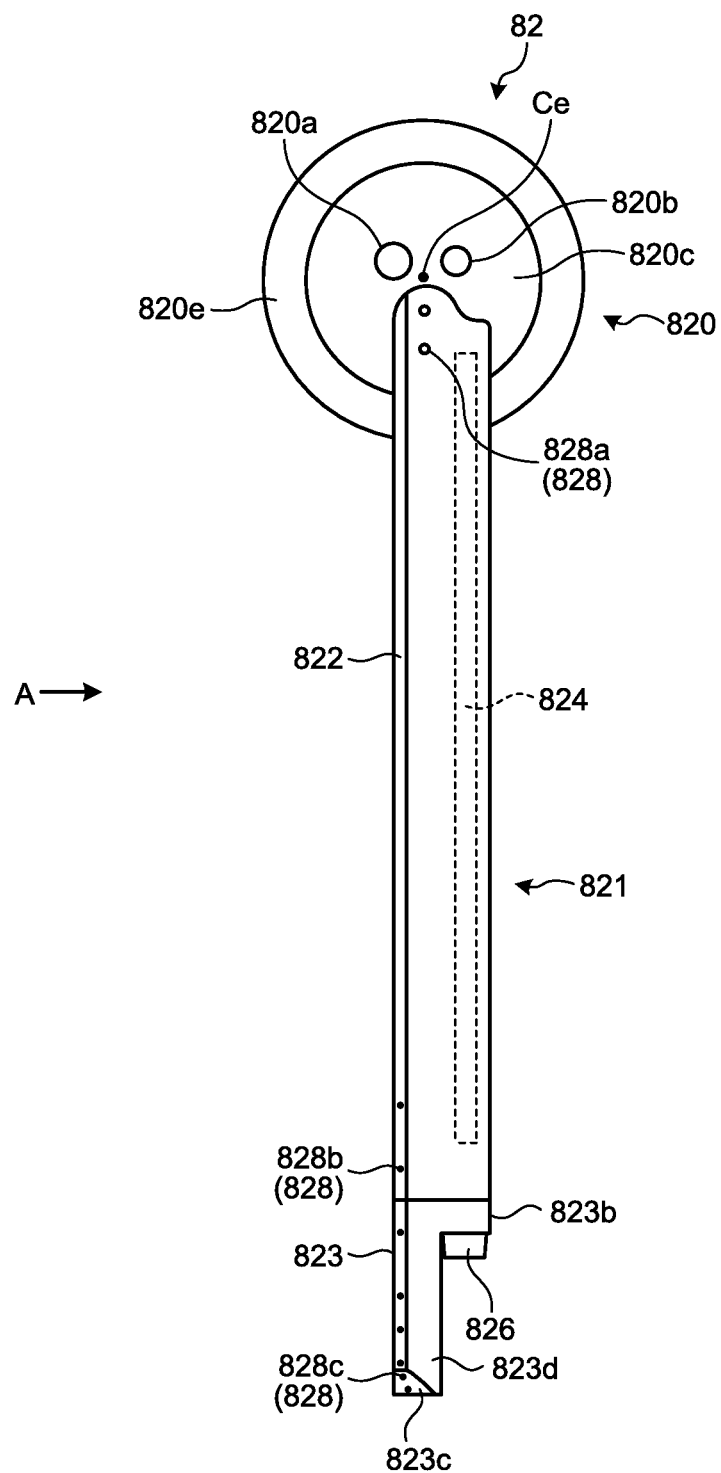
FIG. 4 is a plan view of a nozzle.
Figure 5:
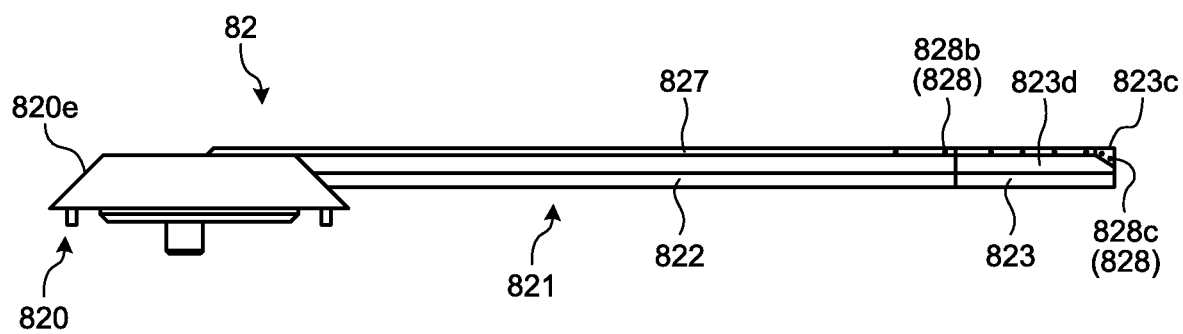
FIG. 5 is a diagram viewed from an arrow A of FIG. 4.
Figure 6:
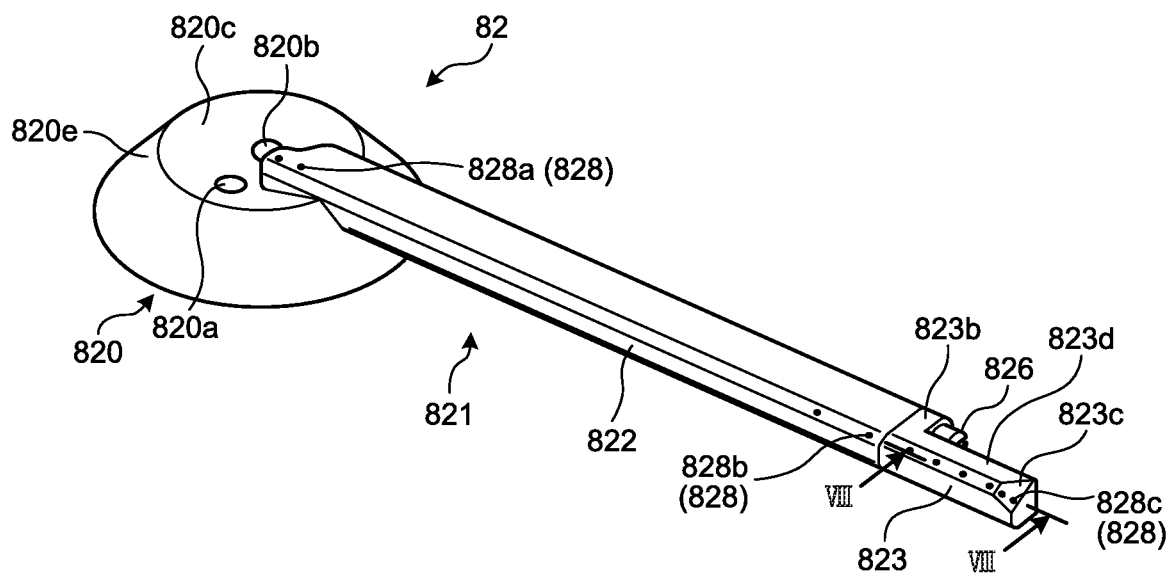
FIG. 6 is a perspective diagram of the nozzle.
Figure 7:
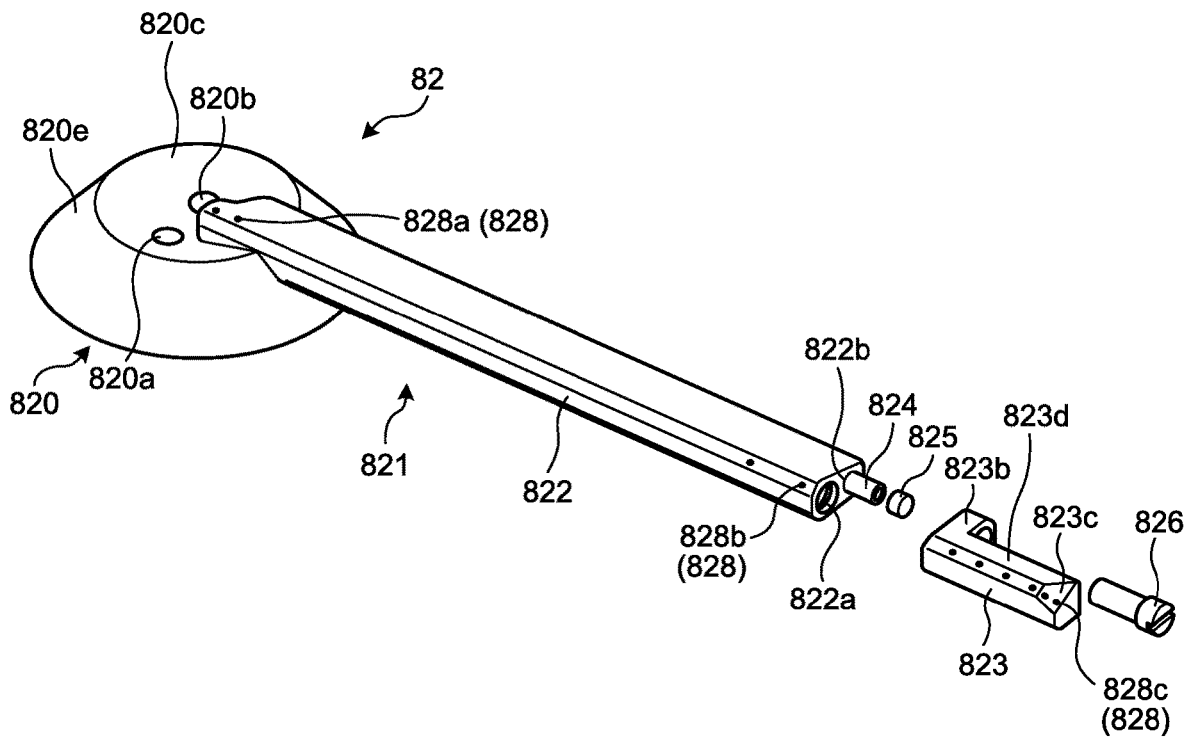
FIG. 7 is an exploded diagram of the nozzle.
Figure 8:
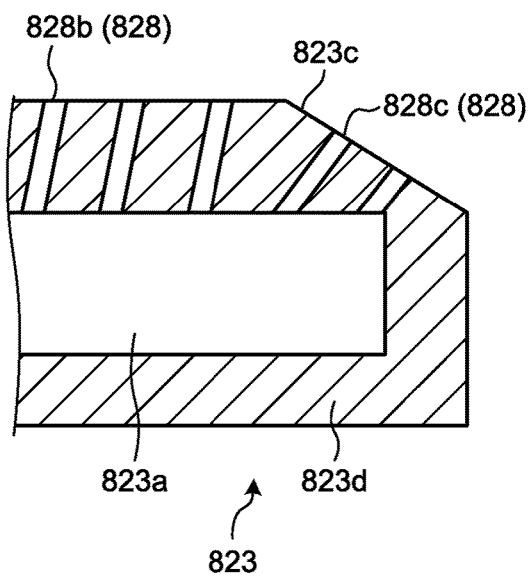
FIG. 8 is a VIII-VIII cross-sectional diagram of FIG. 6.

Herein, the nozzle 82 will be described in detail with reference to FIGS. 4 to 8. FIG. 4 is a plan view of the nozzle 82. FIG. 5 is a diagram viewed from an arrow A of FIG. 4. FIG. 6 is a perspective diagram of the nozzle 82. FIG. 7 is an exploded diagram of the nozzle 82. FIG. 8 is a VIII-VIII cross-sectional diagram of FIG. 6.

The nozzle 82 includes the base 820 and a liquid supply unit 821. The nozzle 82 is provided between the lifting plate 312 (see FIG. 3) and the wafer W (see FIG. 3) to be opposite to the lower surface of the wafer W. In other words, the nozzle 82 is provided below the wafer W. Furthermore, the nozzle 82 is provided to be slightly separated from the lower surface of the wafer W.

The base 820 is arranged coaxially with the shaft 81. In other words, the base 820 is provided to include the rotation axis Ce of the wafer W. The base 820 is attached to the upper end of the shaft 81. The liquid-discharge flow channel 820a that communicates with the second flow channel 81b and the insertion hole 820b into which the N2 nozzle 81d is inserted are formed in the base 820. The liquid-discharge flow channel 820a and the insertion hole 820b are formed along the axial direction. Furthermore, an intermediate flow channel (not illustrated), which communicates with the first flow channel 81a (see FIG. 3) and also communicates with a first liquid supply route 822a, is formed inside the base 820. The first liquid supply route 822a is formed in a nozzle base (also referred to as first liquid supply unit) 822 of the liquid supply unit 821. The intermediate flow channel is formed along the axial direction.

The base 820 is seated on the lifting plate 312 (see FIG. 3) via a bearing (not illustrated). The base 820 rotatably supports the lifting plate 312 and also is lifted and lowered along with the lifting and lowering of the lifting plate 312. In other words, the nozzle 82 (the lower surface processing unit 80) is lifted and lowered along with the lifting plate 312.

A concave portion 820c concave downward is formed in the central portion of the upper end of the base 820. The liquid-discharge flow channel 820a and the insertion hole 820b are opened in the concave portion 820c. The concave portion 820c is formed so that liquid adhering to the concave portion 820c flows into the liquid-discharge flow channel 820a. In other words, the concave portion 820c is formed in a mortar shape so that liquid flows into the liquid-discharge flow channel 820a. For example, the face of the concave portion 820c is formed to converge toward the center of the liquid-discharge flow channel 820a.

The liquid-discharge flow channel 820a and the insertion hole 820b are formed near the rotation axis Ce. In other words, the insertion hole 820b and the N2 nozzle 81d inserted into the insertion hole 820b are provided at a radial-direction outer-side position deviated from the rotation axis Ce. When N2 gas discharged from the N2 nozzle 81d is supplied onto the center of the wafer W, there is a possibility that a droplet smaller than the diameter of the N2 nozzle 81d remains on the wafer W. In order to suppress this problem, the N2 nozzle 81d is provided at the radial-direction outer-side position deviated from the rotation axis Ce.

A sloped portion 820e that slopes toward the peripheral lower side from the periphery of the concave portion 820c is formed on the peripheral portion of the upper end of the base 820. In other words, the sloped portion 820e slopes more downward as it is located on the more outer side in the radial direction. It is desirable that the sloped portion 820e is formed to slope from the center side of the base 820. In other words, it is desirable that the concave portion 820c and the sloped portion 820e are formed so that the periphery of the concave portion 820c is located on the more inner side in the radial direction.

Figure 9:
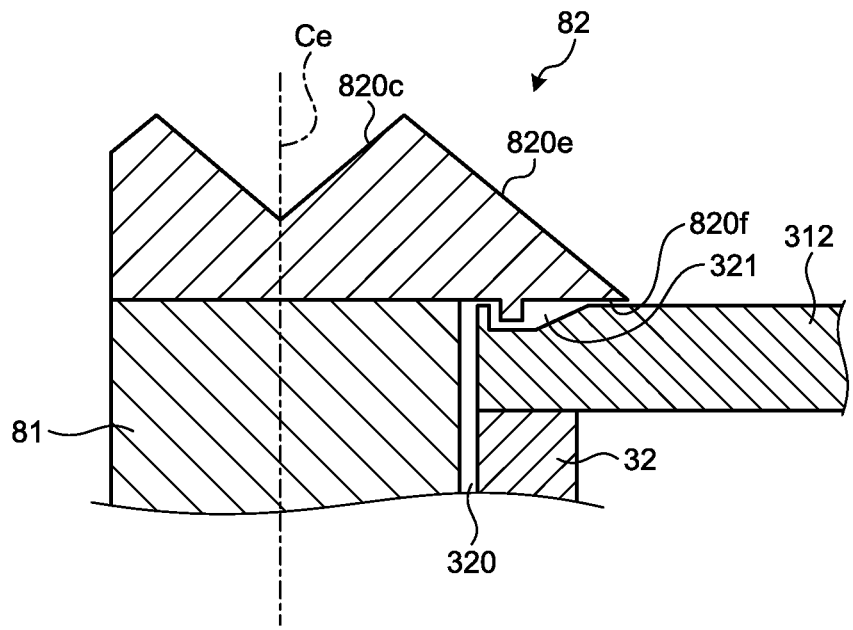
FIG. 9 is a schematic diagram obtained by expanding a part of a lower surface processing unit illustrated in FIG. 3.

As illustrated in FIG. 9, the sloped portion 820e is connected to a lower surface 820f of the base 820. In other words, the sloped portion 820e is formed to extend from the periphery of the concave portion 820c to the lower surface of the base 820. FIG. 9 is a schematic diagram obtained by expanding a part of the lower surface processing unit 80 illustrated in FIG. 3.

A first gap 320 is formed between the shaft 81 and the inner circumferential surface of the insertion hole of the supporting unit 32 into which the shaft 81 is inserted. Furthermore, a second gap 321 to communicate with the first gap 320 is formed between the lifting plate 312 and the lower surface 820f of the base 820. The gaps 320 and 321 as described above are produced between "the shaft 81 and the nozzle 82" that do not rotate and "the supporting unit 32 and the lifting plate 312" that rotate.

When the wafer W, the supporting unit 32, and the lifting plate 312 are rotated, a negative pressure may be generated in the first and second gaps 320 and 321, and thus the center side of the wafer W may be bent downward. In order to prevent this problem, gas, e.g., N2 gas is supplied from the N2 supply source 73 to the first and second gaps 320 and 321. As a result, the rotation of the wafer W in a state where the wafer is bent downward can be suppressed by preventing the generation of a negative pressure, and thus the contact between the wafer W and the nozzle 82 etc. can be suppressed.

However, when N2 gas discharged from the first gap 320 and the second gap 321 touches the lower surface of the wafer W, the temperature of the wafer W becomes low. Thus, there is a possibility that the advance of processing becomes slow or processing on the wafer W is unevenly performed.

In the present embodiment, because the sloped portion 820e is extended up to the lower surface 820f of the base 820, the lower surface 820f of the base 820 can be extended up to the radial-direction outer side, and thus N2 gas can be restrained from being discharged toward the wafer W. As a result, the advance of processing can be restrained from becoming slow, or processing on the wafer W can be restrained from being unevenly performed.

It is more desirable that the sloped portion 820e has an angle formed by the rotation axis Ce and a sloped surface thereof to be a more acute angle while securing the strength of the base 820. For example, the sloped portion 820e is provided so that the angle formed by the rotation axis Ce and the sloped surface thereof becomes around 45 to 50 degrees.

As described above, it is possible to cause liquid adhering onto the upper surface of the base 820 to flow outside the base 820 by providing the sloped portion 820e.

The base 820 is formed so that the height of the upper end of the base 820 becomes lower than that of the upper end of the nozzle base 822 to be described later. As a result, it is possible to cause liquid adhering to a portion of the nozzle base 822 closer to the base 820 to flow toward the concave portion 820c and the sloped portion 820e of the base 820.

The liquid supply unit 821 is formed in a bar shape to extend from near the center of the base 820 toward the radial-direction outer side. The liquid supply unit 821 includes the nozzle base 822 and a nozzle cap (also referred to as second liquid supply unit) 823.

The radial-direction inner-side end portion of the nozzle base 822 is formed to protrude into the concave portion 820c. Herein, the radial-direction inner-side end of the nozzle base 822 is located on the radial-direction outer side of the rotation axis Ce.

The first liquid supply route 822a and a press-fit hole 822b are formed inside the nozzle base 822 along the radial direction. The first liquid supply route 822a and the press-fit hole 822b are formed parallel to each other. The radial-direction inner-side end portion of the press-fit hole 822b is blocked up. A stiffening member 824 is press-fitted into the press-fit hole 822b.

The stiffening member 824 is a metallic component, e.g., stainless steel having a hollow portion. However, the stiffening member 824 is not limited to stainless steel. It is sufficient that the stiffening member 824 is a member for suppressing the deflection of the liquid supply unit 821. Because air within the press-fit hole 822b is discharged to the outside via the hollow portion by making the stiffening member 824 hollow when press-fitting the stiffening member 824 into the press-fit hole 822b, the stiffening member 824 can be easily press-fitted into the press-fit hole 822b. Furthermore, because the stiffening member has a hollow shape, heat keeping effect of the nozzle 82 can be improved and thus the temperature decrease of temperature adjusting liquid flowing through the first liquid supply route 822a can be suppressed.

A sealant 825 is inserted into the radial-direction outer-side end portion of the press-fit hole 822b. Furthermore, a thread groove is formed on the radial-direction outer side of the press-fit hole 822b, and thus the nozzle cap 823 is attached thereto by using a screw (also referred to as fixing portion) 826. The screw 826 is formed of chemical-resistance resin similarly to the nozzle 82.

The nozzle cap 823 is attached to the radial-direction outer-side end of the nozzle base 822. The nozzle cap 823 includes a supply portion 823d, in which a second liquid supply route 823a communicating with the first liquid supply route 822a is formed, and a screw attaching portion (also referred to as attaching portion) 823b in which a screw hole into which the screw 826 is inserted is formed. The nozzle cap 823 is attached to the nozzle base 822 by using the screw 826.

The supply portion 823d is formed so that the second liquid supply route 823a is blocked up at a leading side, namely, the radial-direction outer side of the nozzle cap 823. As described above, a liquid supply route is formed by the first liquid supply route 822a and the second liquid supply route 823a. Furthermore, a tapered portion 823c sloped downward is formed in the leading-side upper portion of the supply portion 823d.

The screw attaching portion 823b is provided on the radial-direction inner side of the leading end of the supply portion 823d so that the screw 826 does not abut on the lifting pins 313 (see FIG. 3) during the rotation of the wafer W. In other words, the nozzle cap 823 is formed to have a substantially L-shaped structure in a plan view.

A step 827 protruding upward is formed on the nozzle base 822 and the nozzle cap 823. For example, the step 827 is formed by a sloped plane that is sloped from the top toward a direction intersecting with the radial direction in a plan view. A plurality of discharge ports 828, which communicate with the liquid supply route to discharge temperature adjusting liquid toward the lower surface of the wafer W, are formed in the step 827. By forming the discharge ports 828 in the step 827, liquid discharged from the liquid-discharge flow channel 820a, for example, can be restrained from flowing into the discharge ports 828.

The discharge ports 828 are formed from the center side of the base 820 to the leading side, namely, the tapered portion 823c of the nozzle cap 823 at predetermined intervals. Furthermore, the discharge ports 828 are formed so that the total area of the discharge ports 828 is smaller than the cross-sectional area of the first flow channel 81a and/or the cross-sectional area of the first liquid supply route 822a at the most radial-direction inner side. As a result, it is possible to uniform the flow volumes of temperature adjusting liquid discharged from the discharge ports 828.

The discharge ports 828 are configured of first discharge ports 828a formed near the center side of the base 820, namely, near the rotation axis Ce, second discharge ports 828b formed on the radial-direction outer side of the first discharge ports 828a, and third discharge ports 828c formed on the tapered portion 823c.

The first discharge ports 828a are formed on a part of the nozzle base 822 that protrudes into the concave portion 820c. The first discharge ports 828a are formed to overlap with the first liquid supply route 822a in up and down directions (vertical direction). Furthermore, the first discharge ports 828a are formed to discharge temperature adjusting liquid along the axial direction. As a result, the temperature adjusting liquid can be discharged to the lower surface near the center of the wafer W.

The first discharge port 828a closest to the rotation axis Ce is formed on the radial-direction outer side of the rotation axis Ce. Because the first discharge port 828a closest to the rotation axis Ce is formed on the radial-direction outer side of the rotation axis Ce, the temperature of the central portion of the wafer W on which a centrifugal force does not act can be restrained from becoming high due to the temperature adjusting liquid discharged from the first discharge port 828a, and thus the process for the central portion of the wafer W can be restrained from advancing more than that for another area. As a result, an etching process can be uniformly performed.

Figure 10:
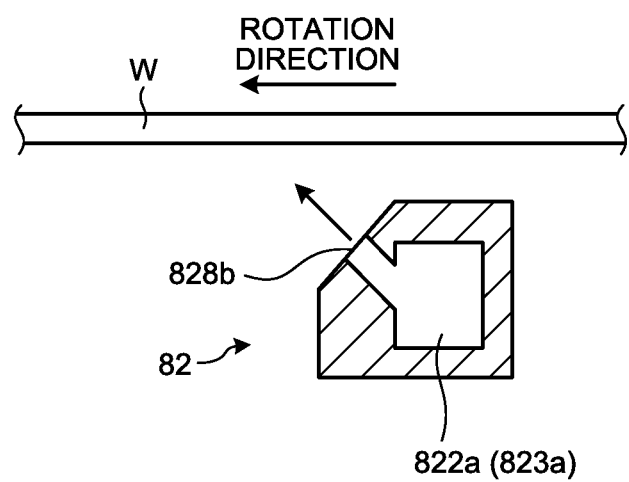
FIG. 10 is a schematic diagram illustrating the discharge direction of temperature adjusting liquid discharged from a second discharge port in a side view.

As illustrated in FIG. 10, the second discharge port 828b is formed not to overlap with the first and second liquid supply routes 822a and 823a in up and down directions at a position deviated from the first and second liquid supply routes 822a and 823a downstream in the rotation direction of the wafer W. The second discharge port 828b discharges temperature adjusting liquid obliquely and upwardly toward a back side of the nozzle 82 in the rotation direction of the wafer W. FIG. 10 is a schematic diagram illustrating the discharge direction of temperature adjusting liquid discharged from the second discharge port 828b in a side view. As a result, temperature adjusting liquid colliding with the wafer W can be restrained from falling toward the nozzle 82, and thus the temperature adjusting liquid can be restrained from adhering to the nozzle 82.

Figure 11:
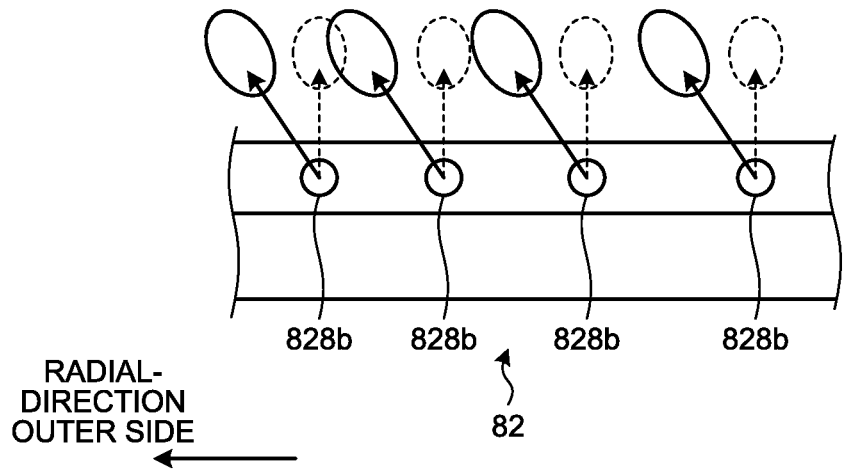
FIG. 11 is a schematic diagram illustrating the discharge direction of temperature adjusting liquid discharged from the second discharge port and the discharge range of temperature adjusting liquid on the lower surface of a wafer.

As illustrated in FIG. 11, the second discharge ports 828b are formed to discharge temperature adjusting liquid toward an outer side (i.e., solid-arrow line of FIG. 11) from a vertical direction (i.e., dashed-arrow line of FIG. 11) with respect to the nozzle 82 in a plan view. In other words, the second discharge ports 828b are formed to discharge temperature adjusting liquid toward the outer side obliquely and upwardly. FIG. 11 is a schematic diagram illustrating the discharge direction of temperature adjusting liquid discharged from the second discharge ports 828b and the discharge range of temperature adjusting liquid on the lower surface of the wafer W. Because discharging temperature adjusting liquid toward the outer side obliquely and upwardly has a longer discharge distance than discharging the liquid toward a direction vertical to the nozzle 82 (i.e., dotted-line range in FIG. 11), the temperature adjusting liquid can be discharged over a wide range (i.e., solid-line range in FIG. 11) of the lower surface of the wafer W. In FIGS. 4 to 7, the second discharge ports 828b are partially omitted.

The basic configuration of the third discharge ports 828c is the same as that of the second discharge ports 828b, and the third discharge ports 828c are formed to discharge temperature adjusting liquid toward the radial-direction outer side of the second discharge ports 828b. As a result, the temperature adjusting liquid can be discharged to the outer-circumferential lower surface of the wafer W to which the liquid supply unit 821 cannot be extended. For example, the temperature adjusting liquid can be discharged to the lower surface of the wafer W located above the lifting pins 313 and the lower surface of the wafer W located on the radial-direction outer side of the lifting pins 313. As a result, it is possible to suppress the temperature decrease in the outer circumferential end of the wafer W.

The third discharge ports 828c may be formed to obliquely and upwardly discharge temperature adjusting liquid toward the radial-direction outer side without discharging the temperature adjusting liquid toward the back side of the nozzle 82 in the rotation direction of the wafer W.

The interval between the second discharge ports 828b of the nozzle cap 823 provided near the tapered portion 823c and the interval between the third discharge ports 828c are shorter than the interval between the second discharge ports 828b closer to the base 820. For example, the interval between the second discharge ports 828b closer to the base 820 is 10 mm, and the interval between the third discharge ports 828c and the interval between the second discharge ports 828b near the tapered portion 823c are 8 mm.

As described above, because the interval between the second discharge ports 828b of the nozzle cap 823 provided near the tapered portion 823c and the interval between the third discharge ports 828c are made short, a supply amount per unit area of the temperature adjusting liquid to be discharged to the peripheral lower surface of the wafer W can be increased.

The second discharge ports 828b may be formed so that the interval between the second discharge ports 828b becomes smaller towards the outer side in the radial direction.

FIGS. 4 to 7 illustrate an example in which the two first discharge ports 828a and the two third discharge ports 828c are formed, but the present disclosure is not limited thereto. In other words, it is sufficient that the number of the ports is one or more.

The outer circumferential end of the nozzle 82, namely, the outer circumferential end of the nozzle cap 823 is located on the radial-direction inner side of the lifting pins 313. For that reason, even if the lifting plate 312 is rotated along with the holding plate 310, the nozzle 82 does not contact with the lifting pins 313.

Figure 12:
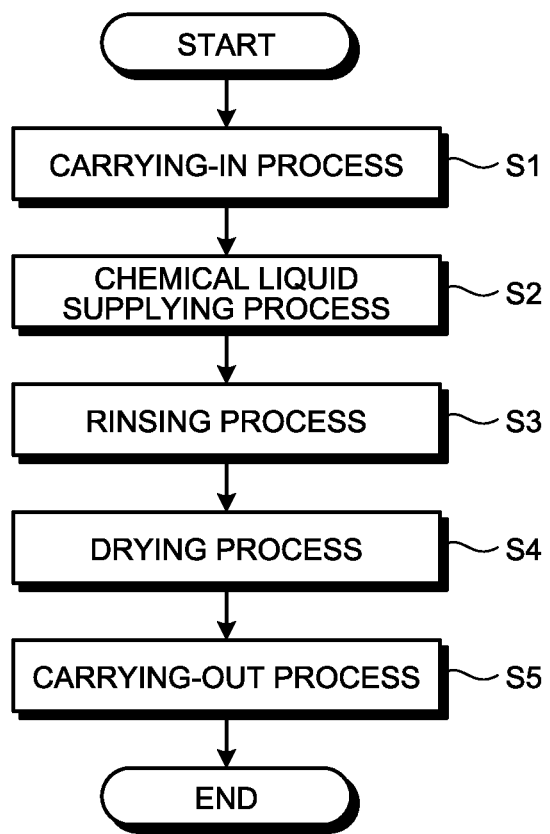
FIG. 12 is a flowchart illustrating a procedure of processing that is executed by the substrate processing system according to the present embodiment.

Next, a procedure of substrate processing that is executed by the substrate processing system 1 according to the present embodiment will be described with reference to FIG. 12. FIG. 12 is a flowchart illustrating a procedure of processing that is executed by the substrate processing system 1 according to the present embodiment. Each process illustrated in FIG. 12 is performed in accordance with the control of the controller 18 of the control device 4.

A carrying-in process for carrying the wafer W into the processing unit 16 is performed by the substrate transfer device 17 (Step S1). In the carrying-in process, the lifting plate 312 is pushed up to a predetermined raising position, and the wafer W is placed on the lifting pins 313 by the substrate transfer device 17. Then, after the wafer is placed on the lifting pins 313, the lifting plate 312 is lowered to cause the substrate holding parts 311 to hold the wafer W. In this state, the nozzle 82 and the lifting pins 313 are slightly separated from the lower surface of the wafer W.

Next, a chemical liquid supplying process is performed in the processing unit 16 (Step S2). In the chemical liquid supplying process, the holding unit 31 is rotated by the driving unit 33 to rotate the wafer W. Then, etchant, e.g., SC1, DHF, and/or SPM is supplied onto the upper surface of the wafer W from an etchant supplying nozzle (not illustrated) of the processing fluid supply unit 40, and also temperature adjusting liquid is supplied onto the lower surface of the wafer W from the nozzle 82 of the lower surface processing unit 80. As a result, an etching process is performed on the upper surface of the wafer W.

At that time, because the temperature adjusting liquid is supplied onto the lower surface of the wafer W from the discharge ports 828, the temperature of the wafer W can be uniformed, and thus the etching process can be uniformly performed on the wafer W.

The etchant supplying nozzle supplies the etchant onto the upper surface of the wafer W while reciprocating from the center to the outer circumferential end of the wafer W. Alternatively, the nozzle 82 that supplies etchant may be independently provided on the outer circumferential end of the wafer W. As a result, the etching process can be uniformly performed on the wafer W.

Next, a rinsing process is performed in the processing unit 16 after the chemical liquid supplying process (Step S3). In the rinsing process, DIW is supplied onto the upper surface of the wafer W from a rinse liquid supplying nozzle (not illustrated) of the processing fluid supply unit 40. Furthermore, DIW is supplied onto the lower surface of the wafer W from the liquid-discharge flow channel 820a of the lower surface processing unit 80. As a result, etchant remaining on the wafer W is washed away by the DIW.

Next, a drying process is performed in the processing unit 16 (Step S4). In the drying process, IPA is supplied onto the upper surface of the wafer W from a drying liquid supplying nozzle (not illustrated) of the processing fluid supply unit 40. Furthermore, N2 gas is supplied onto the lower surface of the wafer W from the N2 nozzle 81d of the lower surface processing unit 80. The drying process is accelerated by supplying N2 gas onto the lower surface of the wafer W.

When the wafer W is rotating, the centrifugal force of the central portion of the wafer W is smaller than that of the peripheral edge of the wafer W. For that reason, liquid easily drops to and thus easily adheres to the central portion of the upper end of the base 820 located under the central portion of the wafer W.

In the above embodiment, the concave portion 820c is formed so that liquid adhering to the central portion of the upper end of the base 820 flows into the liquid-discharge flow channel 820a. For that reason, liquid remaining in the concave portion 820c is little, and thus the liquid remaining in the concave portion 820c can be restrained from adhering to the lower surface of the wafer W during the drying process.

In the drying process, the liquid-discharge flow channel 820a, the second flow channel 81b, and a part of the second pipe 91 communicate with the drain flow channel 91b by switching the switching valve 91a. As a result, because liquid flowing into the liquid-discharge flow channel 820a is discharged via the drain flow channel 91b, liquid can be restrained from adhering to the lower surface of the wafer W. Furthermore, because the vicinity of the opening of the liquid-discharge flow channel 820a has a negative pressure by causing the liquid-discharge flow channel 820a and the drain flow channel 91b to communicate with each other, the liquid remaining in the concave portion 820c is sucked into and discharged via the liquid-discharge flow channel 820a. As a result, the liquid remaining in the concave portion 820c can be further restrained from adhering to the lower surface of the wafer W.

In the rinsing and drying processes, the wafer W is held by the substrate holding parts 311 and is being rotated.

Next, a carrying-out process is performed in the processing unit 16 (Step S5). In the carrying-out process, after the rotation of the wafer W is stopped, the lifting plate 312 is pushed up by the lifting/lowering members 34 up to the predetermined raising position. Then, the wafer W is carried out from the processing unit 16 by the substrate transfer device 17.

Next, effects according to the present embodiment will be described.

Because the liquid-discharge flow channel 820a that is opened in the upper surface of the base 820 functions as a discharge passage, and the concave portion 820c concave downward so that liquid flows toward the liquid-discharge flow channel 820a is formed in the central portion of the upper end of the base 820, liquid remaining in the concave portion 820c can be caused to flow into the liquid-discharge flow channel 820a.

As a result, liquid can be restrained from remaining in the concave portion 820c, and thus liquid remaining in the concave portion 820c can be restrained from adhering to the lower surface of the wafer W.

Because the sloped portion 820e is provided to slope downward from the periphery of the concave portion 820c toward the outside of the base 820 so as to discharge liquid adhering to the upper surface of the base 820 to the outside of the base 820, liquid remaining on the upper surface of the base 820 can be reduced, and thus liquid can be restrained from adhering to the lower surface of the wafer W.

A horizontal plane is not formed on the upper surface of the base 820 by providing the sloped portion 820e from the periphery of the concave portion 820c. For that reason, liquid remaining on the upper surface of the base 820 can be reduced, and thus liquid can be restrained from adhering to the lower surface of the wafer W.

N2 gas etc. is supplied into the first gap 320 formed between the shaft 81 and the supporting unit 32 and into the second gap 321 formed between the lifting plate 312 and the lower surface 820f of the base 820, and the sloped portion 820e is extended up to the lower surface 820f of the base 820.

As a result, when the wafer W is rotated, because a negative pressure is prevented from occurring in the first and second gaps 320 and 321 and the wafer W is restrained from being rotated in a state where the wafer is bent, the wafer W can be restrained from contacting the nozzle 82 etc. Furthermore, because N2 gas discharged from the second gap 321 can be restrained from being discharged toward the wafer W, the wafer W can be restrained from being cooled. For that reason, the advance of processing can be restrained from becoming slow, or processing on the wafer W can be restrained from being unevenly performed.

The first discharge ports 828a are formed to overlap with the first liquid supply route 822a in up and down directions. Furthermore, the second discharge ports 828b are provided on the radial-direction outer side of the first discharge ports 828a, and are formed not to overlap with the first and second liquid supply routes 822a and 823a in up and down directions at positions that are deviated from the first and second liquid supply routes 822a and 823a downstream in the rotation direction of the wafer W.

As a result, temperature adjusting liquid can be discharged to the central lower surface of the wafer W through the first discharge ports 828a. Furthermore, temperature adjusting liquid discharged from the second discharge ports 828b can be restrained from adhering to the nozzle 82.

The step 827 protruding upward is provided in the nozzle 82 and the discharge ports 828 are formed in the step 827. As a result, liquid can be restrained from remaining on the upper surface of the nozzle 82.

Furthermore, the height of the upper end of the base 820 is made lower than that of the upper end of the nozzle base 822. As a result, liquid adhering to a part of the nozzle base 822 closer to the base 820 can be caused to flow into the concave portion 820c and the sloped portion 820e of the base 820.

The tapered portion 823c is provided on the leading-side upper portion of the liquid supply unit 821, and the third discharge ports 828c are formed in the tapered portion 823c. As a result, compared with a case that the tapered portion 823c is not formed, temperature adjusting liquid can arrive at the more outer circumference of the wafer W and thus the temperature adjusting liquid does not easily remain on the leading side of the liquid supply unit 821. Furthermore, the processing of the third discharge ports 828c becomes easy.

Furthermore, the third discharge ports 828c are formed to discharge temperature adjusting liquid toward the radial-direction outer side. As a result, even when the lifting pins 313 are provided below the outer circumferential end of the wafer W, temperature adjusting liquid can be discharged to the lower surface of the outer circumferential end of the wafer W. Therefore, the temperature of the wafer W at its outer circumferential side can be restrained from becoming low, and thus the etching process can be uniformly performed on the wafer W.

The radial-direction inner-side end portion of the nozzle base 822 is formed to protrude into the concave portion 820c, and the first discharge ports 828a are formed in a part of the nozzle base 822 that protrudes into the concave portion 820c. As a result, temperature adjusting liquid, which is discharged from the first discharge ports 828a and collides with the wafer W to drop downward, can be caused to flow into the liquid-discharge flow channel 820a via the concave portion 820c.

The first discharge port 828a closest to the rotation axis Ce is formed on the radial-direction outer side of the rotation axis Ce. As a result, temperature adjusting liquid can be restrained from being discharged to the lower surface on the rotation axis Ce, and thus the process for the central portion of the wafer W on which a centrifugal force does not act can be restrained from advancing more than that for another area. Therefore, the etching process can be uniformly performed on the wafer W.

The discharge ports 828 are formed so that the total area of the discharge ports 828 is smaller than the cross-sectional area of the first flow channel 81a and/or the cross-sectional area of the most radial-direction inner-side part of the first liquid supply route 822a. As a result, the flow volumes of temperature adjusting liquid discharged from the discharge ports 828 can be uniformed.

The liquid supply unit 821 is configured to include the nozzle base 822 and the nozzle cap 823 attached to the radial-direction outer-side leading end of the nozzle base 822. As a result, the liquid supply unit 821 can be formed in a simple configuration.

The nozzle cap 823 includes the supply portion 823d, in which the second liquid supply route 823a is formed, and the screw attaching portion 823b, which is formed on the radial-direction inner side of the leading end of the supply portion 823d to attach the nozzle cap 823 to the nozzle base 822 by using the screw 826. As a result, when the wafer W is rotated, the screw 826 can be prevented from touching the lifting pins 313.

Because the stiffening member 824 is provided in parallel with the first liquid supply route 822a, the liquid supply unit 821 can be restrained from being bent, and the liquid supply unit 821 can be restrained from contacting another member, e.g., the wafer W and/or the lifting plate 312.

Because the hollow portion is provided in the stiffening member 824, heat keeping effect of the nozzle 82 can be improved and the temperature of temperature adjusting liquid can be restrained from becoming low.

Next, an alternative example of the present embodiment will be described below.

In the above embodiment, deionized water that is temperature adjusting liquid is discharged from the nozzle 82, but the present disclosure is not limited thereto. In other words, for example, etchant may be discharged from the nozzle. Furthermore, DIW is supplied onto the lower surface of the wafer W from the liquid-discharge flow channel 820a, but the present disclosure is not limited thereto. In other words, for example, chemical liquid such as SC1 may be supplied onto the lower surface of the wafer W.

In the above embodiment, the chemical liquid supplying process is performed once, but the present disclosure is not limited thereto. In other words, for example, the chemical liquid supplying process may be performed multiple times. Furthermore, a timing, at which the liquid-discharge flow channel 820a and the drain flow channel 91b communicate with each other by switching the switching valve 91a, is not limited to a time in the drying process. In other words, the timing may be a time in another process or a time between processes. As a result, liquid can be restrained from adhering to the lower surface of the wafer W.

In the above embodiment, the stiffening member 824 has a hollow portion, but the present disclosure is not limited thereto. In other words, for example, the stiffening member may have a cylindrical shape that does not have a hollow portion. Furthermore, the stiffening member 824 is press-fitted into the press-fit hole 822b, but the present disclosure is not limited thereto. In other words, for example, the cylindrical stiffening member 824 may be inserted into a hole provided in the nozzle base 822. In addition, when the stiffening member is inserted into a hole, the stiffening member 824 and the hole are adjusted so that a gap between the stiffening member 824 and the hole becomes small. By such a configuration, it is also possible to restrain the deflection of the liquid supply unit 821.

Furthermore, a discharge port or a discharge passage that discharges liquid adhering to the concave portion 820c may be separately provided in the base 820, the shaft 81, or the like.

Furthermore, the surface of the nozzle 82 may be formed of hydrophobic materials. As a result, liquid can be restrained from remaining on the concave portion 820c, the sloped portion 820e, and/or the step 827.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A liquid processing apparatus comprising:
   a holding unit that includes substrate holding parts extending from an outer circumferential end of a holding plate to horizontally hold a substrate by using the substrate holding parts;
   a shaft that includes a rotation axis of the substrate held by the holding unit, the shaft being extended along an axial direction of the rotation axis and being provided below the substrate;
   a supporting part that includes an insertion hole into which the shaft is inserted, and is supported by the inserted shaft to be rotatable with respect to the shaft to rotate along with the holding unit, a bottom end of the supporting part being drivably supported, and a leading end of the supporting part extending from the bottom end into a hole in the holding plate and horizontally supporting the holding unit; and
   a nozzle that ejects liquid toward a lower surface of the substrate,
   the nozzle comprising:
      a base that is attached to an upper end of the shaft; and
      a liquid supply unit that is extended from the base to a radial-direction outer side of the substrate, the liquid supply unit including ejection ports formed to eject the liquid toward the substrate, wherein
   the shaft and the base include a discharge passage that is formed along the axial direction,
   the base includes, on an upper portion thereof, a concave portion whose upper surface exposed to an outside forms at least a part of an upper surface of the base, the upper surface of the concave portion being concave downward,
   an opening of the discharge passage is arranged on the upper surface of the concave portion of the base to cause the liquid, ejected from the ejection ports toward the lower surface of the substrate, on the upper surface of the concave portion to flow toward the opening of the discharge passage, and the opening is provided at a lowermost portion of the concave portion and a radial-direction outer-side position deviated from the rotation axis, and
   the discharge passage discharges the liquid, ejected from the ejection ports toward the lower surface of the substrate, on the upper surface of the concave portion and flowing into the discharge passage through the opening.

2. The liquid processing apparatus according to claim 1, wherein the base further includes a sloped portion that is sloped downward from a periphery of the concave portion toward an outside of the base.

3. The liquid processing apparatus according to claim 2, further comprising:
   a plate that is opposite to a lower surface of the base and the lower surface of the substrate to rotate integrally with the holding unit;
   a first gap formed between the shaft and an inner circumferential surface forming the insertion hole; and
   a second gap that is formed between the lower surface of the base and the plate to communicate with the first gap, wherein gas is supplied to the second gap via the first gap, and
   the sloped portion is extended up to the lower surface of the base.

4. The liquid processing apparatus according to claim 1, wherein
   the liquid supply unit includes a liquid-supply flow channel that is formed along the radial direction of the substrate to communicate with the ejection ports, and
   the ejection ports include:
      one or more first ejection ports that are formed near the base to overlap with the liquid-supply flow channel in up and down directions; and
      one or more second ejection ports that are formed on the radial-direction outer side of the first ejection ports and are formed to be deviated from the liquid-supply flow channel downstream in a rotation direction of the substrate so as not to overlap with the liquid-supply flow channel in the up and down directions.

5. The liquid processing apparatus according to claim 4, wherein
   a part of the liquid supply unit closer to the rotation axis protrudes into the concave portion, and
   the one or more first ejection ports are formed in the part of the liquid supply unit that is located within the concave portion.

6. The liquid processing apparatus according to claim 4, wherein one of the first ejection ports closest to the rotation axis is formed on the radial-direction outer side of the rotation axis.

7. The liquid processing apparatus according to claim 4, wherein
   the liquid supply unit further includes a tapered portion that is formed in a leading-side upper portion of the liquid supply unit, and
   the ejection ports further include one or more third ejection ports that are formed in the tapered portion.

8. The liquid processing apparatus according to claim 7, wherein the one or more third ejection ports are formed to eject the liquid toward the radial-direction outer side.

9. The liquid processing apparatus according to claim 4, wherein
   the liquid supply unit further includes:
   a first liquid supply unit that is extended from the base along the radial direction; and
   a second liquid supply unit that is attached to a radial-direction outer-side end portion of the first liquid supply unit and is extended along the radial direction.

10. The liquid processing apparatus according to claim 9, wherein
    the second liquid supply unit includes:
    a supply portion in which the liquid-supply flow channel and the ejection ports are formed; and
    an attaching portion that is provided on a radial-direction inner side of a leading end of the supply portion and is attached to the first liquid supply unit by using a fixing portion.

11. The liquid processing apparatus according to claim 9, wherein
    the first liquid supply unit includes:
    a hole that is formed, in the nozzle, in parallel with the liquid-supply flow channel; and
    a stiffening member that is formed of a metallic component and is press-fitted into the hole.

12. The liquid processing apparatus according to claim 11, wherein the stiffening member has a hollow shape.

13. The liquid processing apparatus according to claim 1, wherein a total area of the ejection ports is smaller than a cross-sectional area of a flow channel for supplying the liquid to the liquid supply unit.

14. The liquid processing apparatus according to claim 1, wherein the nozzle is formed so that a height of an upper end of the base is lower than that of an upper end of the liquid supply unit.

15. The liquid processing apparatus according to claim 1, wherein the opening of the discharge passage is arranged outside a region of the upper surface of the concave portion that is covered by the liquid supply unit.

* * * * *